United States Patent
Yoo et al.

(10) Patent No.: US 11,751,335 B2
(45) Date of Patent: Sep. 5, 2023

(54) PRINTED CIRCUIT BOARD

(71) Applicant: SAMSUNG ELECTRO-MECHANICS CO., LTD., Suwon-si (KR)

(72) Inventors: So Ree Yoo, Suwon-si (KR); Seung Eun Lee, Suwon-si (KR); Joo Hwan Jung, Suwon-si (KR); Yong Hoon Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 33 days.

(21) Appl. No.: 17/583,582

(22) Filed: Jan. 25, 2022

(65) Prior Publication Data

US 2023/0164921 A1    May 25, 2023

(30) Foreign Application Priority Data

Nov. 22, 2021    (KR) .......................... 10-2021-0161514

(51) Int. Cl.
*H05K 1/18* (2006.01)
*H05K 1/11* (2006.01)

(52) U.S. Cl.
CPC ............. *H05K 1/185* (2013.01); *H05K 1/112* (2013.01); *H05K 1/183* (2013.01); *H05K 2201/096* (2013.01)

(58) Field of Classification Search
CPC ....................... H05K 1/181–185; H05K 1/112
See application file for complete search history.

(56) References Cited

U.S. PATENT DOCUMENTS

| | | | |
|---|---|---|---|
| 9,253,882 B2 * | 2/2016 | Nanjo | H05K 1/0298 |
| 9,420,683 B2 * | 8/2016 | Lee | H01L 23/642 |
| 11,094,637 B2 * | 8/2021 | Rubin | H01L 24/32 |
| 2009/0290318 A1 | 11/2009 | Takahashi | |
| 2016/0302308 A1 * | 10/2016 | Lee | H01L 23/5385 |
| 2020/0083179 A1 * | 3/2020 | Lee | H01L 23/5384 |

FOREIGN PATENT DOCUMENTS

| | | |
|---|---|---|
| JP | WO2009-141927 A1 | 11/2009 |
| JP | 2013-183015 A | 9/2013 |
| KR | 10-2017-0111677 A | 10/2017 |
| KR | 10-2163059 B1 | 10/2020 |

* cited by examiner

*Primary Examiner* — Hoa C Nguyen
(74) *Attorney, Agent, or Firm* — Morgan, Lewis & Bockius LLP

(57) ABSTRACT

A printed circuit board includes: a first substrate including a first cavity and first circuit units; and a second substrate disposed in the first cavity of the first substrate with an electronic component disposed therein, and including second circuit units having a higher density than the first circuit units, wherein the second substrate includes a first region and a second region, the first region of the second substrate includes an outermost circuit layer among the second circuit units, and circuit layers in the first region of the second substrate have a higher density than circuit layers in the second region of the second substrate.

18 Claims, 4 Drawing Sheets

PRINTED CIRCUIT BOARD

CROSS-REFERENCE TO RELATED APPLICATION(S)

This application claims benefit of priority to Korean Patent Application No. 10-2021-0161514 filed on Nov. 22, 2021 in the Korean Intellectual Property Office, the disclosure of which is incorporated herein by reference in its entirety.

TECHNICAL FIELD

The present disclosure relates to a printed circuit board.

BACKGROUND

In order to follow the recent trend of mobile devices towards weight reduction and size reduction, there has also been a growing need for forming printed circuit boards to be mounted thereon lighter, thinner, shorter, and smaller.

Meanwhile, a multilayer board is manufactured by stacking layers on both sides of a core substrate. In this case, a plurality of circuit layers are stacked on one surface of the core substrate that is unnecessary in transmitting a signal, which may cause problems in that productivity may decrease and it may be difficult to manufacture a thin board.

In accordance with the improvement in performance of semiconductors, nodes have become smaller and dies have become larger, causing an increase in cost. In order to reduce the cost, a chiplet usage amount has increased. As a result, it has been necessary to connect a die to another die.

In particular, research is continuing to reduce an electrical signal distance and improve heat dissipation characteristics by embedding a high-density substrate in a low-density substrate and connecting them to each other through vias.

SUMMARY

An aspect of the present disclosure may provide a printed circuit board including microcircuits and/or micro-vias.

Another aspect of the present disclosure may provide a printed circuit board having improved performance in transmitting an electrical signal.

Another aspect of the present disclosure may provide a printed circuit board having an improved heat dissipation function.

According to an aspect of the present disclosure, a printed circuit board may include: a first substrate including a first cavity and first circuit units; and a second substrate disposed in the first cavity of the first substrate with an electronic component disposed therein, and including second circuit units having a higher density than the first circuit units, wherein the second substrate includes a first region and a second region, the first region of the second substrate includes an outermost circuit layer among the second circuit units, and circuit layers in the first region of the second substrate have a higher density than circuit layers in the second region of the second substrate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
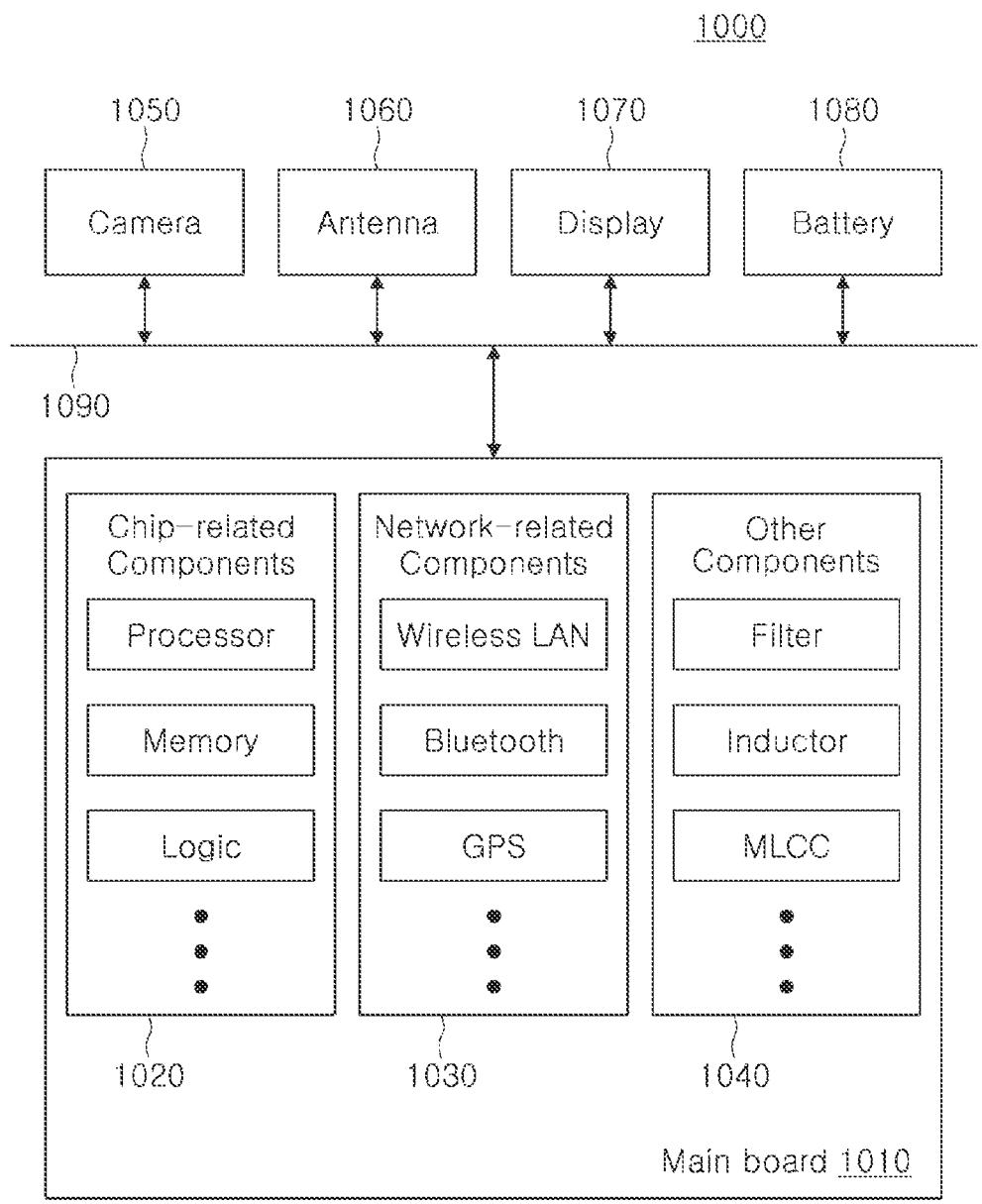
FIG. 1 is a diagram schematically illustrating an example of an electronic device system.

FIG. 1 is a block diagram schematically illustrating an example of an electronic device system.

Referring to FIG. 1, an electronic device 1000 may accommodate a mainboard 1010 therein. The mainboard 1010 may include chip-related components 1020, network-related components 1030, and other components 1040, which are physically and/or electrically connected thereto. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; and a logic chip such as an analog-digital converter or an application-specific integrated circuit (ASIC). The chip-related components 1020 are not limited thereto, but may also include other types of chip-related electronic components. In addition, these electronic components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, longterm evolution (LTE), evolution data only (Ev-DO), high speed packet access+ (HSPA+), high speed downlink packet access+ (HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, but may also include a variety of other wireless or wired standards or protocols. In addition, the network-related components 1030 may be combined with each other, together with the chip-related electronic components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, but also include passive elements in chip component type used for various other purposes, and the like. In addition, the other components 1040 may be combined with each other, together with the chip-related electronic components 1020 and/or the network-related electronic components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, but may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
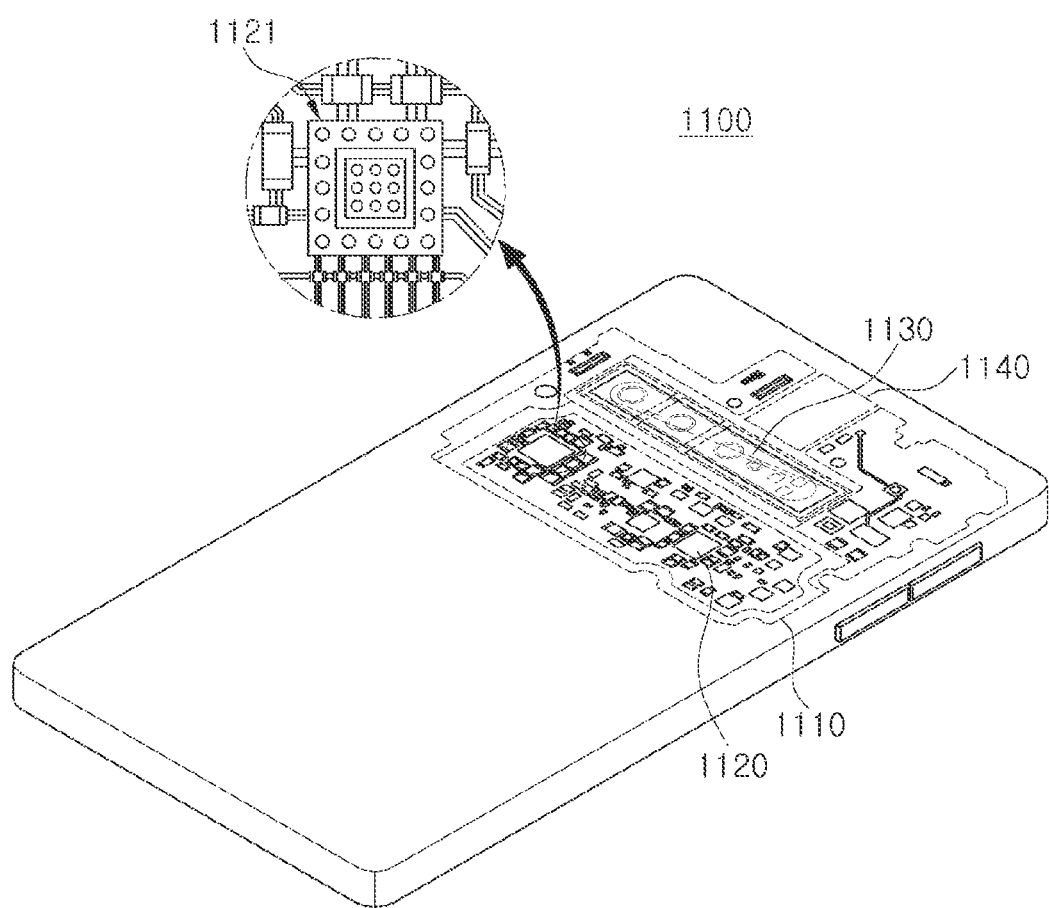
FIG. 2 is a diagram schematically illustrating an example of an electronic device.

FIG. 2 is a perspective view schematically illustrating an example of an electronic device.

Referring to FIG. 2, the electronic device may be, for example, a smartphone 1100. A mainboard 1110 may be accommodated in the smartphone 1100, and various electronic components 1120 may be physically and/or electrically connected to the mainboard 1110. In addition, other electronic components that may or may not be physically and/or electrically connected to the mainboard 1110, such as a camera module 1130 and/or a speaker 1140, may also be accommodated therein. Some of the electronic components 1120 may be the above-described chip-related components, e.g., an antenna module 1121, but are not limited thereto. The antenna module 1121 may be in such a form that the electronic component is surface-mounted on a printed circuit board, but is not limited thereto. Meanwhile, the electronic device is not necessarily limited to the smartphone 1100, but may be any other electronic device as described above.

Printed Circuit Board

Figure 3:
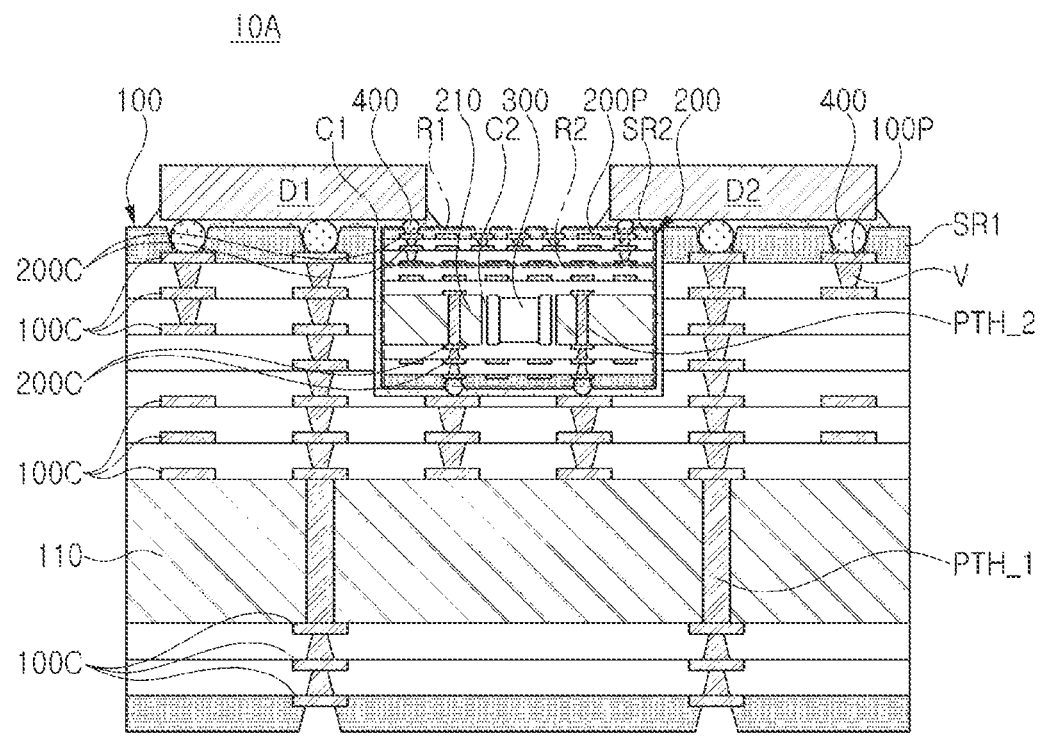
FIG. 3 is a diagram schematically illustrating an example of a printed circuit board according to the present disclosure.

FIG. 3 is a diagram schematically illustrating an example of a printed circuit board 10A according to the present disclosure.

Referring to FIG. 3, the printed circuit board 10A according to the present disclosure may include: a first substrate 100 including a first cavity C1 and first circuit units 100C including one or more circuit layers; and a second substrate 200 disposed in the first cavity C1 of the first substrate with an electronic component 300 disposed therein, and including second circuit units 200C having a higher density than the first circuit units 100C of the first substrate 100.

Here, the density of the circuit layers may correspond to a horizontal/planar spacing or pitch between circuit patterns disposed on the same level or layer, or may correspond to an interlayer spacing between circuit patterns disposed on adjacent (neighboring) levels or layers although not on the same level or layer, but is not limited thereto.

In addition, the second substrate 200 may include: a first region R1 including one or more circuit layers, including an outermost circuit layer among the second circuit units 200C of the second substrate 200, and one or more insulating layers; and a second region R2 excluding the first region R1 of the second substrate 200, and the circuit layers in the first region R1 may have a higher density than the circuit layers in the second region R2.

Here, the density of the circuit layers may correspond to a horizontal/planar spacing or pitch between circuit patterns disposed on the same level or layer, or may correspond to an interlayer spacing between circuit patterns disposed on adjacent (neighboring) levels or layers although not on the same level or layer, but is not limited thereto.

In the printed circuit board 10A according to the present disclosure, the second substrate 200 may be disposed inside the first cavity C1 of the first substrate 100. In this case, a remaining area inside the first cavity C1 after disposing the second substrate 200 may be filled with an insulating material. The insulating material may have function as a known filling or sealing material or the like, but is not limited thereto.

In particular, the electronic component 300 disposed inside the second substrate 200 may be a passive electronic component. More specifically, the electronic component 300 may be embedded inside the second substrate 200, and in this case, the embedded electronic component 300 may be a passive electronic component such as an inductor, a resistor, or a capacitor, but is not limited thereto. More specifically, the passive electronic component 300 disposed inside the second substrate 200 of the printed circuit board 10A according to the present disclosure may be a multilayer ceramic capacitor (MLCC).

In this case, since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

In addition, each of the first and second substrates 100 and 200 of the printed circuit board 10A according to the present disclosure may include one or more insulating layers. In this case, each of the insulating layers in the first and second substrates 100 and 200 may include a known insulating material, but is not limited thereto.

The printed circuit board 10A according to the present disclosure may include dies D1 and D2 at least partially connected to circuit layers disposed as respective outermost layers among the first and second circuit units 100C and 200C of the first and second substrates 100 and 200. In this case, a plurality of dies may be arranged, but the number of dies is not limited thereto. In addition, each die may be connected to both the outermost circuit layer among the first circuit units 100C of the first substrate 100 and the outermost circuit layer among the second circuit units 200C of the second substrate 200.

Here, the outermost circuit layer may be a circuit layer located outermost among the first or second circuit units 100C and 200C of the first or second substrate 100 or 200, and connected to a package substrate, an electronic component, or a die, or may be a circuit layer on which a connection pad is disposed, but is not limited thereto.

In addition, the printed circuit board 10A according to the present disclosure may include first and second solder resist layers SR1 and SR2 at least partially covering the respective outermost circuit layers of the first and second substrates 100 and 200. In this case, an insulating material for fixing the dies D1 and D2 may be disposed on the outermost circuit layers of the first and second substrates 100 and 200 on which the dies D1 and D2 are mounted, and the insulating material may include a known material with a known function, but is not limited thereto.

The printed circuit board 10A according to the present disclosure may further include first and second connection pads 100P and 200P disposed in the outermost circuit layers of the first and second substrates 100 and 200, respectively. The first and second connection pads 100P and 200P may be connected to the dies D1 and D2 by one or more solders 400, respectively, but are not limited thereto.

In addition, in the printed circuit board 10A according to the present disclosure, first and second core substrates 110 and 210 may be disposed in the first and second substrates 100 and 200, respectively. In this case, the second substrate 200 may be disposed above one surface of the first core substrate 110 of the first substrate 100 (for example, when the printed circuit board 10A is oriented with the outermost circuit layers facing toward the top of FIGS. 3-5), with one or more first circuit units 100C and one or more insulating layers between the first core substrate 110 and the second substrate 200, but is not limited thereto.

In addition, the printed circuit board 10A according to the present disclosure may further include a first through-hole PTH_1 penetrating through the first core substrate 110 of the first substrate, and a second through-hole PTH_2 penetrating through the second core substrate 210 of the second substrate.

The first and second through-holes PTH_1 and PTH_2 may be formed by a known method, and may include a known conductive material, but are not limited thereto.

In addition, the printed circuit board 10A according to the present disclosure may include a second cavity C2 in the second core substrate 210 of the second substrate 200, and the passive electronic component 300 may be disposed inside the second cavity C2 of the second substrate.

In particular, in the printed circuit board 10A according to the present disclosure, an interlayer spacing between the first circuit units 100C of the first substrate 100 may be wider than that between the second circuit units 200C of the second substrate 200. That is, the first circuit units 100C of the first substrate 100 may have a lower density than the second circuit units 200C of the second substrate 200.

In addition, the second substrate 200 of the printed circuit board 10A according to the present disclosure may include a first region R1 including two or more circuit layers, including an outermost circuit layer, and two or more insulating layers, and a second region R2 excluding the first region R1 of the second substrate 200. In this case, an interlayer spacing between the circuit layers included in the first region R1 of the second substrate 200 may be narrower than that in the second region R2 of the second substrate 200. That is, the circuit layers in an upper region of the second substrate 200 may have a higher density than the circuit layers in a lower region including the second core substrate 210 of the second substrate 200.

The printed circuit board 10A according to the present disclosure may further include one or more build-up insulating layers on which the circuit layers of the first and second substrates 100 and 200 are disposed, respectively, and one or more vias V at least partially penetrating through the build-up insulating layers. In this case, the vias V may be tapered toward the first core substrate 110 inside the first substrate 100 and toward the second core substrate 210 inside the second substrate 200, but are not limited thereto.

Since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

Each of the insulating layers of the first and second substrates 100 and 200 of the printed circuit board 10A according to the present disclosure may be formed by using at least one of a thermosetting resin such as an epoxy resin, a thermoplastic resin such as a polyimide resin, and a resin in which the thermosetting or thermoplastic resin is impregnated together with an inorganic filler in a core material such as a glass fiber (glass cloth or glass fabric), for example, prepreg, Ajinomoto build-up film (ABF), FR-4, or bismaleimide triazine (BT).

In addition, each of the first and second circuit units 100C and 200C, the through-holes PTH_1 and PTH_2, and the vias V may be formed by using a conductive material such as copper (Cu), aluminum (Al), silver (Ag), tin (Sn), gold (Au), nickel (Ni), lead (Pb), titanium (Ti), palladium (Pd), or an alloy thereof, but is not limited thereto. In this case, the via may be a via penetrating through each of the insulating layers of the first and second substrates 100 and 200, but is not limited thereto.

In addition, each of the first and second circuit units 100C and 200C, the through-holes PTH_1 and PTH_2, and the vias V of the printed circuit board 10A according to the present disclosure may include an electroless plating layer and an electrolytic plating layer. The electroless plating layer may serve as a seed layer for the electrolytic plating layer, but is not limited thereto.

In this case, the electroless plating layer and the electrolytic plating layer filling the first and second circuit units 100C and 200C, the through-holes PTH_1 and PTH_2, and the vias V may also include copper (Cu), aluminum (Al), silver (Ag), tin (Sn), gold (Au), nickel (Ni), lead (Pb), titanium (Ti), palladium (Pd), or an alloy thereof.

The outermost circuit layer formed on one surface of the insulating layer disposed on each of the first and second substrates 100 and 200 may at least partially include a surface treatment layer, and the surface treatment layer may include a different composition from each of the circuit layers. For example, each of the circuit layers may include copper (Cu), and the surface treatment layer may include nickel (Ni) or tin (Sn), but the circuit layers and the surface treatment layer are not limited thereto.

In addition, the first and second solder resist layers SR1 and SR2, each at least partially covering the outermost circuit layer on which the surface treatment layer is formed, may be further disposed on respective one surfaces of the outermost insulating layers disposed as respective one surfaces of the first and second substrates 100 and 200 of the printed circuit board 10A according to the present disclosure. In this case, the first and second solder resist layers SR1 and SR2 may be formed of a photosensitive material. In addition, the first and second solder resist layers SR1 and SR2 may have thermosetting and/or photocurable properties, but are not limited thereto.

In this case, since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

Figure 4:
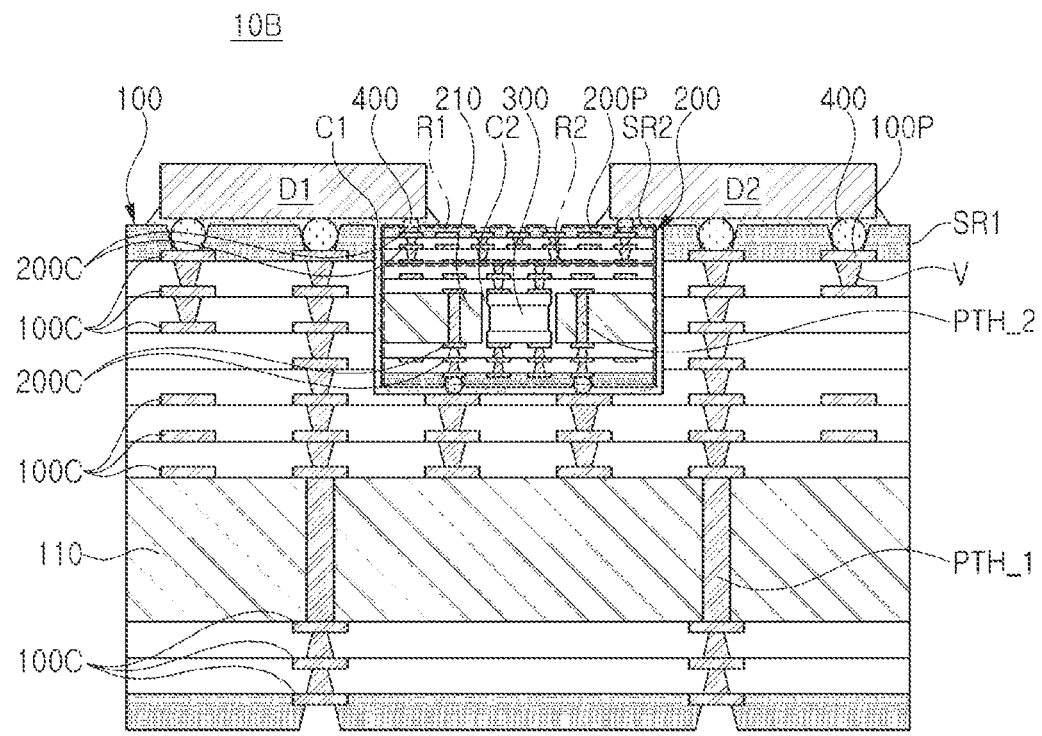
FIG. 4 is a diagram schematically illustrating an example of a printed circuit board according to the present disclosure.

FIG. 4 is a diagram schematically illustrating an example of a printed circuit board 10B according to the present disclosure.

Referring to FIG. 4, the printed circuit board 10B according to the present disclosure may include: a first substrate 100 including a first cavity C1 and one or more first circuit units 100C; and a second substrate 200 disposed in the first cavity C1 of the first substrate with an electronic component 300 disposed therein, and including second circuit units 200C having a higher density than the first circuit units 100C of the first substrate 100.

In addition, the second substrate 200 may include: a first region R1 including one or more circuit layers, including an outermost circuit layer among the second circuit units 200C of the second substrate 200, and one or more insulating layers; and a second region R2 excluding the first region R1 of the second substrate 200, and the circuit layers in the first region R1 may have a higher density than the circuit layers in the second region R2.

Here, the density of the circuit layers may correspond to a horizontal/planar spacing or pitch between circuit patterns disposed on the same level or layer, or may correspond to an interlayer spacing between circuit patterns disposed on adjacent (neighboring) levels or layers although not on the same level or layer, but is not limited thereto.

In the printed circuit board 10B according to the present disclosure, the second substrate 200 may be disposed inside the first cavity C1 of the first substrate 100. In this case, a remaining area inside the first cavity C1 after disposing the second substrate 200 may be filled with an insulating material. The insulating material may function as a known filling or sealing material or the like, but is not limited thereto.

In particular, the electronic component 300 disposed inside the second substrate 200 may be a passive electronic component. More specifically, the electronic component 300 may be embedded inside the second substrate 200, and in this case, the embedded electronic component 300 may be a passive electronic component such as an inductor, a resistor, or a capacitor, but is not limited thereto. More specifically, the passive electronic component 300 disposed inside the second substrate 200 of the printed circuit board 10B according to the present disclosure may be a low inductance ceramic capacitor (LICC).

In this case, since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

In addition, each of the first and second substrates 100 and 200 of the printed circuit board 10B according to the present disclosure may include one or more insulating layers. In this case, each of the insulating layers in the first and second substrates 100 and 200 may include a known insulating material, but is not limited thereto.

The printed circuit board 10B according to the present disclosure may include dies D1 and D2 at least partially connected to circuit layers disposed as respective outermost layers among the first and second circuit units 100C and 200C of the first and second substrates 100 and 200. In this case, a plurality of dies may be arranged, but the number of dies is not limited thereto. In addition, each die may be connected to both the outermost circuit layer among the first circuit units 100C of the first substrate 100 and the outermost circuit layer among the second circuit units 200C of the second substrate 200.

Here, the outermost circuit layer may be a circuit layer located outermost among the first or second circuit units 100C and 200C of the first or second substrate 100 or 200, and connected to a package substrate, an electronic component, or a die, or may be a circuit layer on which a connection pad is disposed, but is not limited thereto.

In addition, the printed circuit board 10B according to the present disclosure may include first and second solder resist layers SR1 and SR2 at least partially covering the respective outermost circuit layers of the first and second substrates 100 and 200. In this case, an insulating material for fixing the dies D1 and D2 may be disposed on the outermost circuit layers of the first and second substrates 100 and 200 on which the dies D1 and D2 are mounted, and the insulating material may include a known material with a known function, but is not limited thereto.

The printed circuit board 10B according to the present disclosure may further include first and second connection pads 100P and 200P disposed in the outermost circuit layers of the first and second substrates 100 and 200, respectively. The first and second connection pads 100P and 200P may be connected to the dies D1 and D2 by one or more solders 400, respectively, but are not limited thereto.

In addition, in the printed circuit board 10B according to the present disclosure, first and second core substrates 110 and 210 may be disposed in the first and second substrates 100 and 200, respectively. In this case, the second substrate 200 may be disposed above one surface of the first core substrate 110 of the first substrate 100, with one or more first circuit units 100C and one or more insulating layers between the first core substrate 110 and the second substrate 200, but is not limited thereto.

In addition, the printed circuit board 10B according to the present disclosure may further include a first through-hole PTH_1 penetrating through the first core substrate 110 of the first substrate, and a second through-hole PTH_2 penetrating through the second core substrate 210 of the second substrate.

The first and second through-holes PTH_1 and PTH_2 may be formed by a known method, and may include a known conductive material, but are not limited thereto.

In addition, the printed circuit board 10B according to the present disclosure may include a second cavity C2 in the second core substrate 210 of the second substrate 200, and the passive electronic component 300 may be disposed inside the second cavity C2 of the second substrate.

In particular, in the printed circuit board 10B according to the present disclosure, an interlayer spacing between the first circuit units 100C of the first substrate 100 may be wider than that between the second circuit units 200C of the second substrate 200. That is, the first circuit units 100C of the first substrate 100 may have a lower density than the second circuit units 200C of the second substrate 200.

In addition, the second substrate 200 of the printed circuit board 10B according to the present disclosure may include a first region R1 including two or more circuit layers, including an outermost circuit layer, and two or more insulating layers, and a second region R2 excluding the first region R1 of the second substrate 200. In this case, an interlayer spacing between the circuit layers included in the first region R1 of the second substrate 200 may be narrower than that in the second region R2 of the second substrate 200. That is, the circuit layers in an upper region of the second substrate 200 may have a higher density than the circuit layers in a lower region including the second core substrate 210 of the second substrate 200.

Since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

Concerning the other components, what has been described above is substantially identically applicable, and thus, the description thereof will not be repeated.

Figure 5:
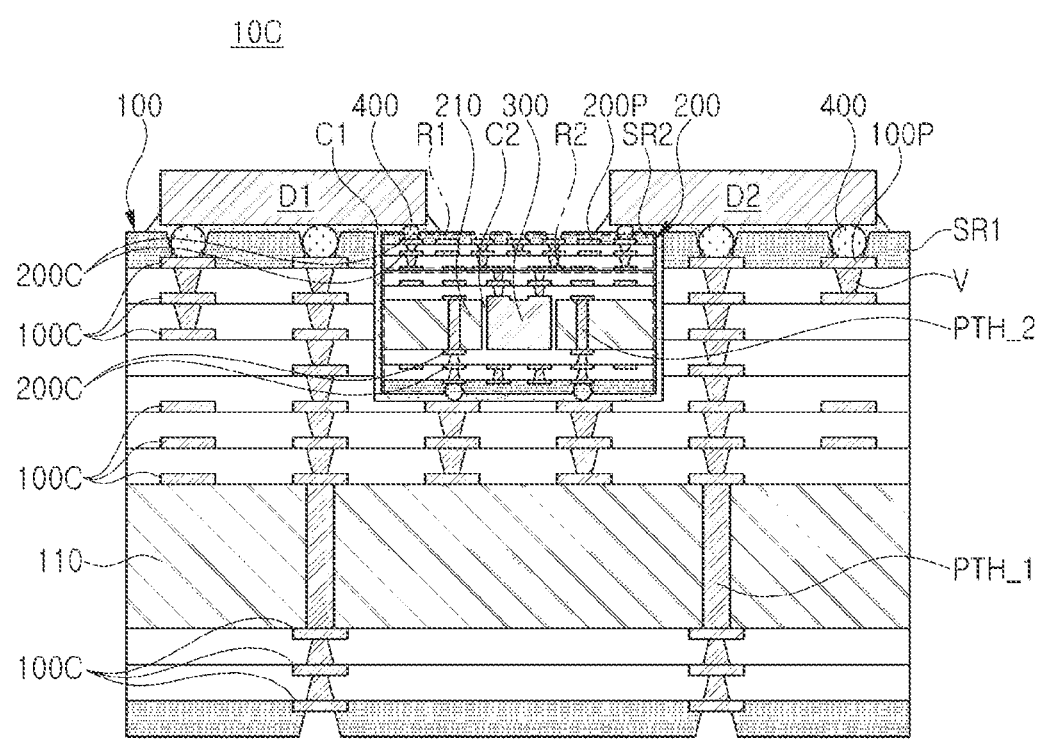
FIG. 5 is a diagram schematically illustrating an example of a printed circuit board according to the present disclosure.

FIG. 5 is a diagram schematically illustrating an example of a printed circuit board 10C according to the present disclosure.

Referring to FIG. 5, the printed circuit board 10C according to the present disclosure may include: a first substrate 100 including a first cavity C1 and one or more first circuit unit 100C; and a second substrate 200 disposed in the first cavity C1 of the first substrate with an electronic component 300 disposed therein, and including second circuit units 200C having a higher density than the first circuit units 100C of the first substrate 100.

Here, the density of the circuit layers may correspond to a horizontal/planar spacing or pitch between circuit patterns disposed on the same level or layer, or may correspond to an interlayer spacing between circuit patterns disposed on adjacent (neighboring) levels or layers although not on the same level or layer, but is not limited thereto.

In addition, the second substrate 200 may include: a first region R1 including one or more circuit layers, including an outermost circuit layer among the second circuit units 200C of the second substrate 200, and one or more insulating layers; and a second region R2 excluding the first region R1 of the second substrate 200, and the circuit layers in the first region R1 may have a higher density than the circuit layers in the second region R2.

Here, the density of the circuit layers may correspond to a horizontal/planar spacing or pitch between circuit patterns disposed on the same level or layer, or may correspond to an interlayer spacing between circuit patterns disposed on adjacent (neighboring) levels or layers although not on the same level or layer, but is not limited thereto.

In the printed circuit board 10C according to the present disclosure, the second substrate 200 may be disposed inside the first cavity C1 of the first substrate 100. In this case, a remaining area inside the first cavity C1 after disposing the second substrate 200 may be filled with an insulating material. The insulating material may function as a known filling or sealing material or the like, but is not limited thereto.

In particular, the electronic component 300 disposed inside the second substrate 200 may be a passive electronic component. More specifically, the electronic component 300 may be embedded inside the second substrate 200, and in this case, the embedded electronic component 300 may be a passive electronic component such as an inductor, a resistor, or a capacitor, but is not limited thereto. More specifically, the passive electronic component 300 disposed inside the second substrate 200 of the printed circuit board 10C according to the present disclosure may be a silicon (Si) capacitor.

In this case, since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

In addition, each of the first and second substrates 100 and 200 of the printed circuit board 10C according to the present disclosure may include one or more insulating layers. In this case, each of the insulating layers in the first and second substrates 100 and 200 may include a known insulating material, but is not limited thereto.

The printed circuit board 10C according to the present disclosure may include dies D1 and D2 at least partially connected to circuit layers disposed as respective outermost layers among the first and second circuit units 100C and 200C of the first and second substrates 100 and 200. In this case, a plurality of dies may be arranged, but the number of dies is not limited thereto. In addition, each die may be connected to both the outermost circuit layer among the first circuit units 100C of the first substrate 100 and the outermost circuit layer among the second circuit units 200C of the second substrate 200.

Here, the outermost circuit layer may be a circuit layer located outermost among the first or second circuit units 100C and 200C of the first or second substrate 100 or 200, and connected to a package substrate, an electronic component, or a die, or may be a circuit layer on which a connection pad is disposed, but is not limited thereto.

In addition, the printed circuit board 10C according to the present disclosure may include first and second solder resist layers SR1 and SR2 at least partially covering the respective outermost circuit layers of the first and second substrates 100 and 200. In this case, an insulating material for fixing the dies D1 and D2 may be disposed on the outermost circuit layers of the first and second substrates 100 and 200 on which the dies D1 and D2 are mounted, and the insulating material may include a known material with a known function, but is not limited thereto.

The printed circuit board 10C according to the present disclosure may further include first and second connection pads 100P and 200P disposed in the outermost circuit layers of the first and second substrates 100 and 200, respectively. The first and second connection pads 100P and 200P may be connected to the dies D1 and D2 by one or more solders 400, respectively, but are not limited thereto.

In addition, in the printed circuit board 10C according to the present disclosure, first and second core substrates 110 and 210 may be disposed in the first and second substrates 100 and 200, respectively. In this case, the second substrate 200 may be disposed above one surface of the first core substrate 110 of the first substrate 100, with one or more first circuit units 100C and one or more insulating layers between the first core substrate 110 and the second substrate 200, but is not limited thereto.

In addition, the printed circuit board 10C according to the present disclosure may further include a first through-hole PTH_1 penetrating through the first core substrate 110 of the first substrate, and a second through-hole PTH_2 penetrating through the second core substrate 210 of the second substrate.

The first and second through-holes PTH_1 and PTH_2 may be formed by a known method, and may include a known conductive material, but are not limited thereto.

In addition, the printed circuit board 10C according to the present disclosure may include a second cavity C2 in the second core substrate 210 of the second substrate 200, and the passive electronic component 300 may be disposed inside the second cavity C2 of the second substrate.

In particular, in the printed circuit board 10C according to the present disclosure, an interlayer spacing between the first circuit units 100C of the first substrate 100 may be wider than that between the second circuit units 200C of the second substrate 200. That is, the first circuit units 100C of the first substrate 100 may have a lower density than the second circuit units 200C of the second substrate 200.

In addition, the second substrate 200 of the printed circuit board 10C according to the present disclosure may include a first region R1 including two or more circuit layers, including an outermost circuit layer, and two or more insulating layers, and a second region R2 excluding the first region R1 of the second substrate 200. In this case, an interlayer spacing between the circuit layers included in the first region R1 of the second substrate 200 may be narrower than that in the second region R2 of the second substrate 200. That is, the circuit layers in an upper region of the second substrate 200 may have a higher density than the circuit layers in a lower region including the second core substrate 210 of the second substrate 200.

Since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

Concerning the other components, what has been described above is substantially identically applicable, and thus, the description thereof will not be repeated.

Method of Manufacturing Printed Circuit Board

A method of manufacturing a printed circuit board 10 according to the present disclosure may be as follows.

First, a first core substrate 110 with a first through-hole PTH_1 formed therein may be prepared. In this case, circuit layers integrally formed with the first through-hole PTH_1 may be formed to protrude from both surfaces of the first core substrate 110. The first through-hole PTH_1 may be formed by a known method, and may include a known conductive material, but is not limited thereto.

Thereafter, insulating layers embedding the protruding circuit layers may be disposed on both surfaces of the first core substrate 110. In this case, the insulating layers stacked on each of both surfaces of the first core substrate 110 may be one or more build-up insulating layers.

Thereafter, one or more vias V penetrating through the one or more insulating layers may be formed together with one or more first circuit units 100C disposed on respective one surfaces of the insulating layers.

Thereafter, a first cavity C1 may be formed in one surface of the first substrate 100 in which the insulating layers are stacked. The first cavity C1 may be formed by using a laser or blasting method or the like, but is not limited thereto, and may be formed by using any known method.

Then, a second substrate 200 may be disposed in the first cavity C1 of the first substrate 100.

The method of forming the second substrate 200 may be as follows.

First, a second core substrate 210 with a second through-hole PTH_2 formed therein may be prepared. In this case, circuit layers integrally formed with the second through-hole PTH_2 may be formed to protrude from both surfaces of the second core substrate 210. The second through-hole PTH_2 may be formed by a known method, and may include a known conductive material, but is not limited thereto.

Thereafter, a second cavity C2 penetrating through the second core substrate 210 may be formed. The first cavity C1 may be formed by using a laser or blasting method or the like, but is not limited thereto, and may be formed by using any known method.

Thereafter, an electronic component 300 may be disposed in the second cavity C2 of the second core substrate 210. In this case, the electronic component 300 may be a passive electronic component. More specifically, the embedded electronic component 300 may be a passive electronic component such as an inductor, a resistor, or a capacitor, but is not limited thereto. More specifically, the passive electronic component 300 disposed inside the second substrate 200 of the printed circuit board 10 according to the present disclosure may be a multilayer ceramic capacitor (MLCC), a low inductance ceramic capacitor (LICC), or a silicon (Si) capacitor.

Thereafter, insulating layers embedding the protruding circuit layers may be disposed on both surfaces of the second core substrate 210. In this case, the insulating layers stacked on each of both surfaces of the second core substrate 210 may be one or more build-up insulating layers.

Thereafter, one or more vias V penetrating through the one or more insulating layers may be formed together with one or more second circuit units 200C disposed on respective one surfaces of the insulating layers. In this case, the second circuit units 200C disposed on both surfaces of the second core substrate 210 of the second substrate 200 may have a higher density than the first circuit units 100C of the first substrate 100.

Here, the density of the circuit layers may correspond to a horizontal/planar spacing or pitch between circuit patterns disposed on the same level or layer, or may correspond to an interlayer spacing between circuit patterns disposed on adjacent (neighboring) levels or layers although not on the same level or layer, but is not limited thereto.

In addition, the second substrate 200 may include: a first region R1 including one or more circuit layers, including an outermost circuit layer among the second circuit units 200C of the second substrate 200, and one or more insulating layers; and a second region R2 excluding the first region R1 of the second substrate 200, and the circuit layers in the first region R1 may have a higher density than the circuit layers in the second region R2.

Here, the density of the circuit layers may correspond to a horizontal/planar spacing or pitch between circuit patterns disposed on the same level or layer, or may correspond to an interlayer spacing between circuit patterns disposed on adjacent (neighboring) levels or layers although not on the same level or layer, but is not limited thereto.

In addition, first and second solder resist layers SR1 and SR2 covering the outermost circuit layers may be disposed on respective one surfaces of outermost insulating layers of the first and second substrates 100 and 200, and the outermost circuit layers exposed from the first and second solder resist layers SR1 and SR2 may function as first and second connection pads 100P and 200P, respectively. In this case, the circuit layers functioning as the first and second connection pads 100P and 200P may be connected to dies D1 and D2, each connected to both the first and second substrates 100 and 200, through solders 400, but are limited thereto.

Since the second substrate 200 having high-density circuits is disposed inside the first substrate 100 having low-density circuits, with the second substrate 200 having higher-density circuits than the first substrate 100, and the passive electronic component 300 as in any of the above-described exemplary embodiments is included in the second substrate 200, electrical properties can be improved. More specifically, since the passive electronic component is embedded in the high-density substrate, power integrity can be used efficiently, and overheating, malfunction, or the like can be prevented. In addition, it is possible to shorten a signal transmission path, thereby reducing a signal delay in power integrity, but the technical effects of the invention according to the present disclosure are not limited to what has been described above.

Concerning the other components, what has been described above is substantially identically applicable, and thus, the description thereof will not be repeated.

As set forth above, as one effect of the present disclosure, it is possible to provide a printed circuit board including microcircuits and/or micro-vias.

As another effect of the present disclosure, it is possible to provide a printed circuit board having improved performance in transmitting an electrical signal.

As another effect of the present disclosure, it is possible to provide a printed circuit board having an improved heat dissipation function.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first substrate including a first cavity and first circuit units; and
   a second substrate disposed in the first cavity of the first substrate with an electronic component disposed therein, and including second circuit units having a higher density than the first circuit units,
   wherein the second substrate includes a first region and a second region,
   the first region of the second substrate includes an outermost circuit layer among the second circuit units,
   circuit layers in the first region of the second substrate have a higher density than circuit layers in the second region of the second substrate, and
   along a stacking direction of the circuit layers, the second circuit units overlap the electronic component.

2. The printed circuit board of claim 1, wherein the electronic component disposed inside the second substrate is a passive electronic component.

3. The printed circuit board of claim 1, wherein the first circuit units of the first substrate include an outermost circuit layer among the first circuit units, and
   the printed circuit board further comprises a die at least partially connected to both the outermost circuit layers of the first and second substrates.

4. The printed circuit board of claim 3, further comprising first and second solder resist layers at least partially covering the outermost circuit layers of the first and second substrates, respectively.

5. The printed circuit board of claim 3, wherein the outermost circuit layers of the first and second substrates include first and second connection pads, respectively.

6. The printed circuit board of claim 5, wherein the first and second connection pads are connected to the die through one or more solders, respectively.

7. The printed circuit board of claim 1, wherein the first substrate further includes a first core substrate, and
   the second substrate is disposed above one surface of the first core substrate of the first substrate.

8. The printed circuit board of claim 7, further comprising a first through-hole penetrating through the first core substrate of the first substrate.

9. The printed circuit board of claim 1, wherein the second substrate further includes a second core substrate having a second cavity, and
   the electronic component is disposed inside the second cavity of the second core substrate.

10. The printed circuit board of claim 9, further comprising a second through-hole penetrating through the second core substrate of the second substrate.

11. The printed circuit board of claim 9, wherein the second substrate includes the first region, the second region, and the second core substrate, in order.

12. The printed circuit board of claim 1, wherein an interlayer spacing between the first circuit units of the first substrate is wider than that between the second circuit units of the second substrate.

13. The printed circuit board of claim 1, wherein, among the second circuit units of the second substrate, an interlayer spacing between the circuit layers in the first region is narrower than that between the circuit layers in the second region.

14. The printed circuit board of claim 1, wherein the first and the second substrates further include one or more vias connecting the first and second circuit units of the first and the second substrates to each other, respectively.

15. The printed circuit board of claim 14, wherein, in the stacking direction of the circuit layers, the one or more vias directly connect to a surface of the electronic component facing toward the outermost circuit layer of the second substrate.

16. The printed circuit board of claim 1, wherein, in the stacking direction of the circuit layers, the second circuit units do not directly contact a first surface of the electronic component facing away from the outermost circuit layer of the second substrate.

17. The printed circuit board of claim 16, wherein, in the stacking direction of the circuit layers, the second circuit units do not directly contact a second surface of the electronic component opposing the first surface.

18. The printed circuit board of claim 17, wherein, in the stacking direction of the circuit layers, the second circuit units do not directly contact one or more side surfaces of the electronic component.

\* \* \* \* \*